United States Patent
Dumitru et al.

(10) Patent No.: US 9,098,257 B2
(45) Date of Patent: Aug. 4, 2015

(54) INFORMATION HANDLING SYSTEM SERVER ARCHITECTURE FOR IMPROVED MANAGEMENT COMMUNICATION

(75) Inventors: Aurelian Dumitru, Round Rock, TX (US); Jimmy D. Pike, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 1105 days.

(21) Appl. No.: 13/020,637

(22) Filed: Feb. 3, 2011

(65) Prior Publication Data
US 2012/0203393 A1    Aug. 9, 2012

(51) Int. Cl.
*G06F 1/26*   (2006.01)
*G06F 1/20*   (2006.01)
*H05K 7/20*   (2006.01)

(52) U.S. Cl.
CPC *G06F 1/206* (2013.01); *G06F 1/26* (2013.01); *H05K 7/20836* (2013.01)

(58) Field of Classification Search
CPC .................................. G06F 1/26; G06F 1/206
USPC .................................................. 713/300, 320
See application file for complete search history.

(56) References Cited

U.S. PATENT DOCUMENTS

| | | | |
|---|---|---|---|
| 5,777,874 A * | 7/1998 | Flood et al. | 700/82 |
| 7,272,735 B2 | 9/2007 | Fung | |
| 7,562,239 B2 | 7/2009 | Fung | |
| 2002/0007464 A1 * | 1/2002 | Fung | 713/320 |
| 2002/0010801 A1 | 1/2002 | Meagher et al. | |
| 2006/0265609 A1 | 11/2006 | Fung | |
| 2006/0282685 A1 * | 12/2006 | Bahali et al. | 713/300 |
| 2007/0027948 A1 * | 2/2007 | Engebretsen | 709/203 |
| 2009/0265045 A1 * | 10/2009 | Coxe, III | 700/300 |
| 2010/0172076 A1 * | 7/2010 | Cravens et al. | 361/679.02 |

* cited by examiner

*Primary Examiner* — Jaweed A Abbaszadeh
*Assistant Examiner* — Terrell Johnson
(74) *Attorney, Agent, or Firm* — Terrile, Cannatti, Chambers & Holland, LLP; Robert W. Holland

(57) ABSTRACT

An information handling system server chassis manages plural server resources disposed on sleds in chassis slots with a power supply control board that allocates power from one or more power supplies to the slots. The power supply control board interfaces with an external network and includes one or more network interface cards that provide an Ethernet interface with power distribution boards disposed on sleds in the slots. The power distribution boards manage application of power to server resources and communication by the power supply control board through the Ethernet interface to manage functions at the server resources.

19 Claims, 4 Drawing Sheets

INFORMATION HANDLING SYSTEM SERVER ARCHITECTURE FOR IMPROVED MANAGEMENT COMMUNICATION

BACKGROUND OF THE INVENTION

1. Field of the Invention

The present invention relates in general to the field of information handling system management, and more particularly to an information handling system server architecture for improved management communication.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Server information handling systems have become the backbone of many high technology enterprises. Server information handling systems support enterprise employees in the design, creation, manufacture and sale of enterprise goods and services. In order to ensure reliable information handling processing resources, enterprises often use redundant server information handling systems at locations distal from each other so that power or other disruptions will not interrupt enterprise operations. Broadband network communications tend to make the physical location of server information handling systems immaterial to enterprise use of the server information handling systems, however, locating server information handling systems distal enterprise locations can introduce difficulty in maintenance of the server information handling systems. For example, if a physical component needs replacement, an information technology specialist with adequate training will need to access the system. In order to minimize the need for physical access, server information handling systems often incorporate a management subsystem that allows remote "off-line" access to a server information handling system. For instance, a management subsystem typically allows remote power up and power down of a server through a management interface.

A number of difficulties arise with remote management of server information handling systems. One difficulty is that server information handling systems tend to have a complex hardware architecture that require well-trained technicians when repairs are needed. For instance, plural server information handling systems are often maintained in a common chassis with shared power supply and cooling resources. In addition to wiring used for enterprise network operations, server information handling systems include wiring that supports management subsystem operations. For instance, a serial concentrator supports serial interfaces between a network switch and the motherboard of each server information handling system. Large chassis systems support 24 or more server information handling system motherboards so that a fully populated chassis tends to have a complex wiring arrangement with a diverse variety of components, many of which are replaceable when a failure occurs. The need for trained technicians who can maintain complex chassis configurations tends to increase the expense of enterprise network operations. When failures do occur on enterprise server information handling systems, interruptions in enterprise operations caused by a system failure can result in significant disruptions for enterprise employees and customers.

SUMMARY OF THE INVENTION

Therefore a need has arisen for a system and method which supports ease of maintenance for server information handling system chassis having plural information handling systems.

In accordance with the present invention, a system and method are provided which substantially reduce the disadvantages and problems associated with previous methods and systems for maintaining information handling systems disposed in a chassis. An information handling system server chassis architecture assigns power distribution and fan control functions to separate circuit boards for ease of maintenance and replacement. Ethernet interfaces between a chassis controller and server resource provide a direct telnet from an external network to a server resource for simplified access and reduced complexity in chassis communication of management information.

More specifically, an information handling system is built into a chassis having plural slots, a common power supply for the slots and chassis level cooling. A power supply control board disposed on a sled inserted in a chassis slot provides chassis power and cooling management, and supports communication between an external network and server resource boards disposed on sleds in other chassis slots by establishing a telnet through a chassis-based local area network. A power distribution board is disposed in each sled having server resources, the power distribution board having an Ethernet interface to communicate with the power supply control board and a serial interface with the server resources to perform management functions at the server resources. Operational information, such as temperatures sensed at server resources, is communicated from the power distribution board through the Ethernet interface to the power supply control board for managing power allocation and cooling fan speeds. Cooling fan speeds are set at the power control supply board and sent through an Ethernet interface to a fan control board for managing fan speeds. Separate circuit boards for fan control, power supply control and power distribution managed through fast and reliable Ethernet interfaces simplifies chassis operate, maintenance and upgrades for improved reliability and reduced operational costs.

The present invention provides a number of important technical advantages. One example of an important technical advantage is that a simplified chassis architecture provides communication for management of server sleds with a Telenet through a management platform rather than a serial concentrator so that normal network communications support remote management functions. Chassis components are divided into function-specific sleds for ease of replacement in the event of failure. Providing a Telenet through a power management sled and power distribution sled reduces the number of different types of wiring connections and improves communication rates and reliability. Another example of an important technical advantage is shorter adoption cycles for new server technologies. By offloading the systems management functions off from the server board onto components described herein, the system designer can refresh the design of the server board without having to re-qualify the management functions.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 1A depicts a front view of an information handling system chassis that uses Ethernet for server resource management;

FIG. 1B depicts a back view of an information handling system chassis that uses Ethernet for server resource management;

DETAILED DESCRIPTION

Figure 2:
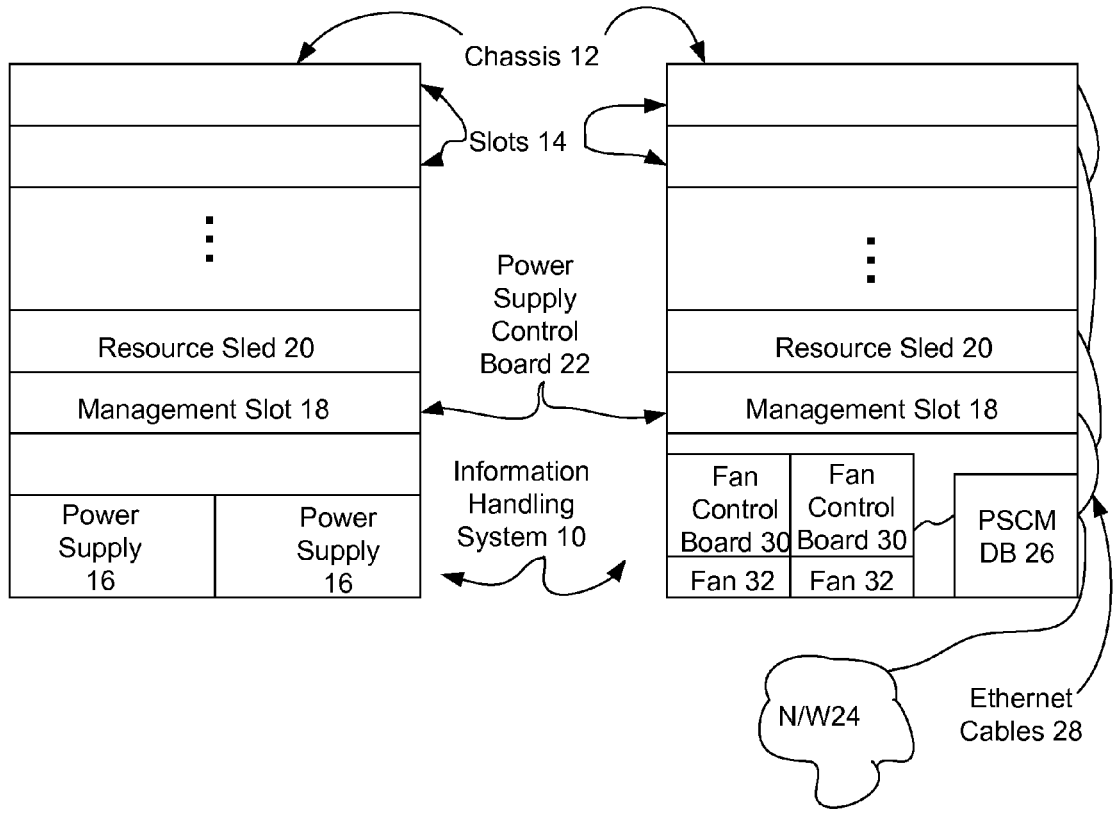
FIG. 2 depicts a block diagram of a management slot that manages operation of server resources through an Ethernet interface.
Figure 2:
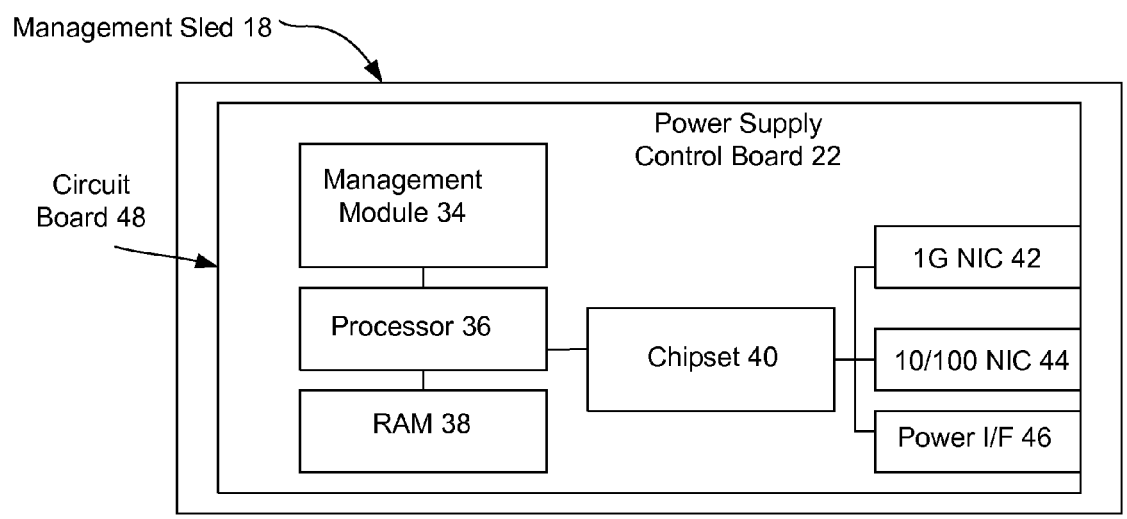

Management of information handling system server resources by a power supply control board of a management sled provides Ethernet communications for management information in a simplified architecture. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to FIG. 1A, a front view depicts an information handling system chassis that uses Ethernet for server resource management. Information handling system 10 is built in a chassis 12 having plural slots 14 that support server resources, such as a processor that serves information to clients or storage devices that store information accessible to clients through a network. Chassis 12 includes one or more power supplies 16 that provide power to each slot 14 for use by server resources disposed in the slots. A management sled inserts in one slot 14 to provide management of server resources disposed in chassis 12, such as allocation and control of power to slots 14. One or more resource sleds 20 are disposed in slots 14 to provide server functionality. Chassis 12 includes Ethernet wiring, such as Cat 5 cables, to support communications between management sled 18 and resource sleds 20.

Referring now to FIG. 1B, a back view depicts an information handling system chassis 12 that uses Ethernet for server resource management. Management slot 18 includes a power supply control board that acts as a central point of communication for information to allocate and control power to chassis slots 14, to manage chassis cooling and to manage server resource operation. Power supply control board 22 has a first Ethernet connection, such as though a 1 Gb network interface card, with an external network 24 to accept management commands and management information from distal locations through network 24. Power supply control board 22 has a second Ethernet connection, such as through a 10/100 Mb network interface card, that provides communication to a power supply control module databoard 26 having switching resources and Ethernet cable 28 connections to each slot 14 of chassis 12. Logical management resources executing on power supply control board 22 control communications from external network 24 to server resources disposed on server sleds 20 in slots 14 of chassis 12. In alternative embodiments, network 24 can interface directly with switch 26 for direct communications with slots 14 under the direction of power supply control board 22, such as with permissions based on security information stored in management sled 18. In addition to managing communications with slots 14, power supply control board 22 provides communications of temperature information for use by fan control modules 30, which control the operation of cooling fans 32. For example, temperature measurements taken at a resource sled 20 are communicated through Ethernet cables 28 to power control supply board 22 and then to fan control module 30 for managing cooling air flow at the location of the temperature. By moving power and fan control functions to their own circuit boards, the chassis architecture allows simplified upgrades and maintenance.

Figure 1C:
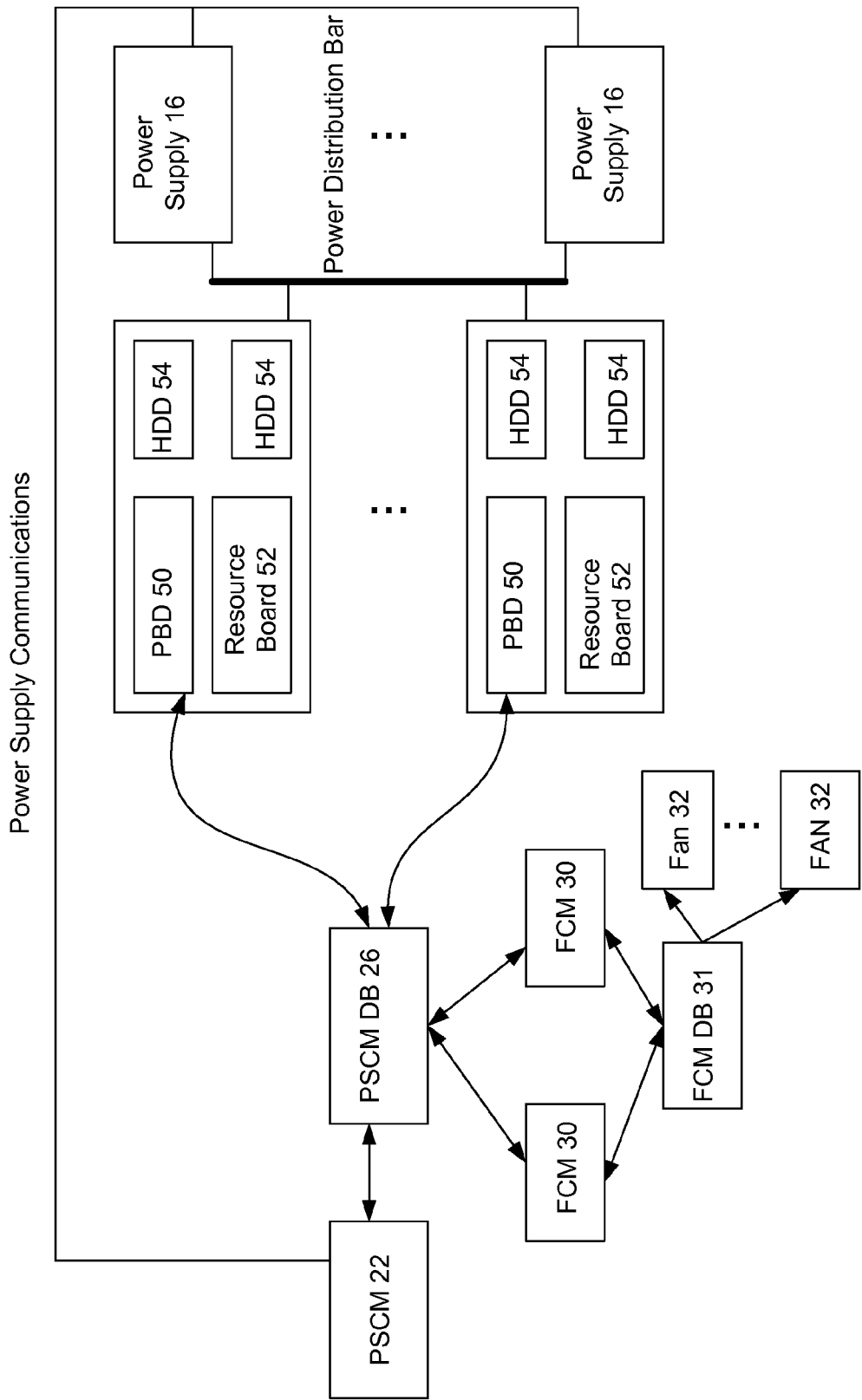
FIG. 1C depicts a block diagram of physical communication between elements within an information handling system chassis.

Referring to FIG. 1C a block diagram depicts physical communication between elements within an information handling system chassis as set forth in FIGS. 1A and 1B. Power supply control board 22 allows chassis management of resource boards 52 through Ethernet switching provided by power supply control module databoard 26. A user accesses chassis management with an external network interface to power supply control module 22 to see performance metrics for each resource board 52 installed in the chassis. A power distribution board 50 associated with each resource board 52 provides conversion of Ethernet communications to a serial or IPMI link with the chipset of its associated resource board 52 so that external users with an approved network link through power control system board 22 can access resources of resource boards 52. Power supply control module databoard 26 also provides communications for thermal management by providing temperature readings from power distribution boards 50 to power supply control board 22 for determining fan speeds and by providing fan speed commands from power supply control module 22 to fan control modules 30. A fan control module databoard 31 selects which of the redundant fan control modules 30 should provide fan control signals to fans 32. Power supply control board 22 communicates directly with power supplies 16 to apply desired power levels to a power distribution bar disposed in the chassis for powering the resources sleds. By using discrete power distribution boards 50 and resource boards 52 and by removing power distribution and cooling functions from resource sleds, upgrades and maintenance are performed more easily.

Referring now to FIG. 2, a block diagram depicts a management sled 18 that manages operation of server resources through an Ethernet interface with a power supply control board 22. Management sled 18 is a chassis sled sized to fit in a chassis slot and equipped with logical resources to provide chassis management functions. For example, a management module 34 executing on a processor 36 and RAM 38 coordinates communication of management information through a chipset 40, a 1 Gb NIC 42, a 10/100 NIC 44 and a power system serial interface 46. Management functions of management sled 18 are supported through a circuit board 48 that allows maintenance or replacement with a new circuit board or a new management sled. If adequate room exists, additional resources may be added to management sled 18, such as storage devices or a server motherboard. Communication of management information through an Ethernet structure provides rapid and reliable communication with reduced complexity, such as the complexity involved in communication through serial interfaces and a serial communications concentrator. The management architecture allows remote information technology administrators to telnet directly into server resources, such as server motherboards disposed on resource sleds 20.

Figure 3:
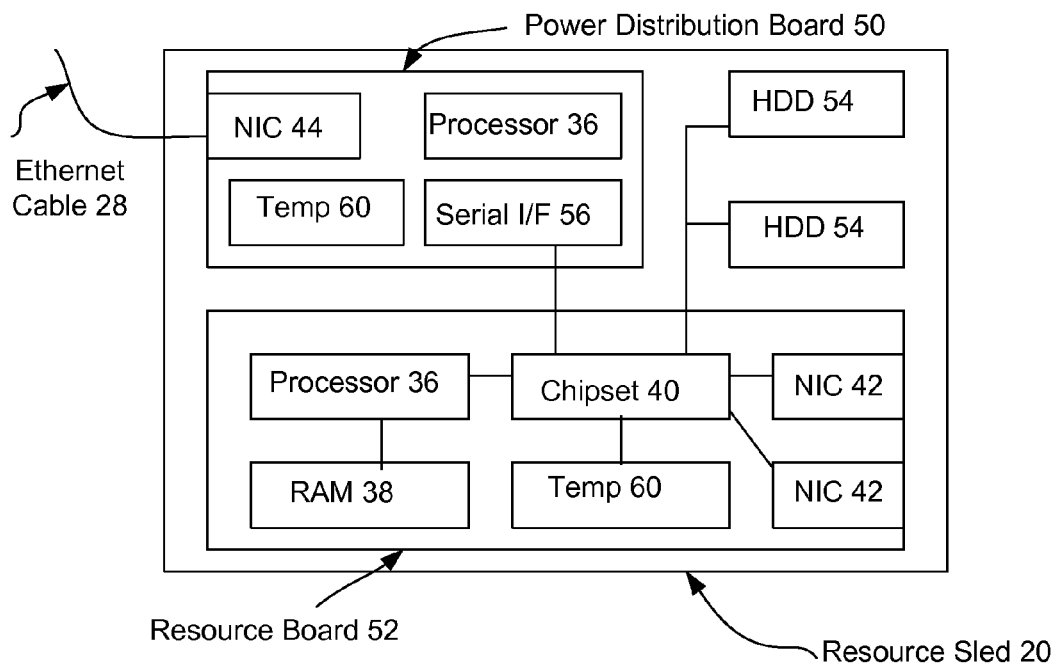
FIG. 3 depicts a block diagram of a server resource sled having a power distribution board.

Referring now to FIG. 3, a block diagram depicts a server resource sled 20 having a power distribution board 50. One or more server resource boards 52 and storage devices 54 are disposed in resource sled 20 provide server operations, such as supporting clients through an enterprise network. Server resource board 52 is a server information handling system motherboard that provides server functions with a CPU 36, RAM 38, chipset 40 and plural network interface cards 42. Power distribution board 50 interfaces with server resource board 52 through a serial interface 56 to perform management functions provided to power distribution board 50 through an Ethernet interface 28. Power distribution board 50 is a circuit board 48 that manages power distribution at resource sled 20 in accordance with allocations directed by power supply control board 22, such as with a power distribution application 58 running on processor 36 and communicating with a NIC 44. In addition, power distribution board 50 communicates temperatures measured by sensors 60 to power supply control board 22 for use by fan control module 30. A power distribution board 50 resides in each resource sled 20 to manage resources of the sled.

Figure 4:
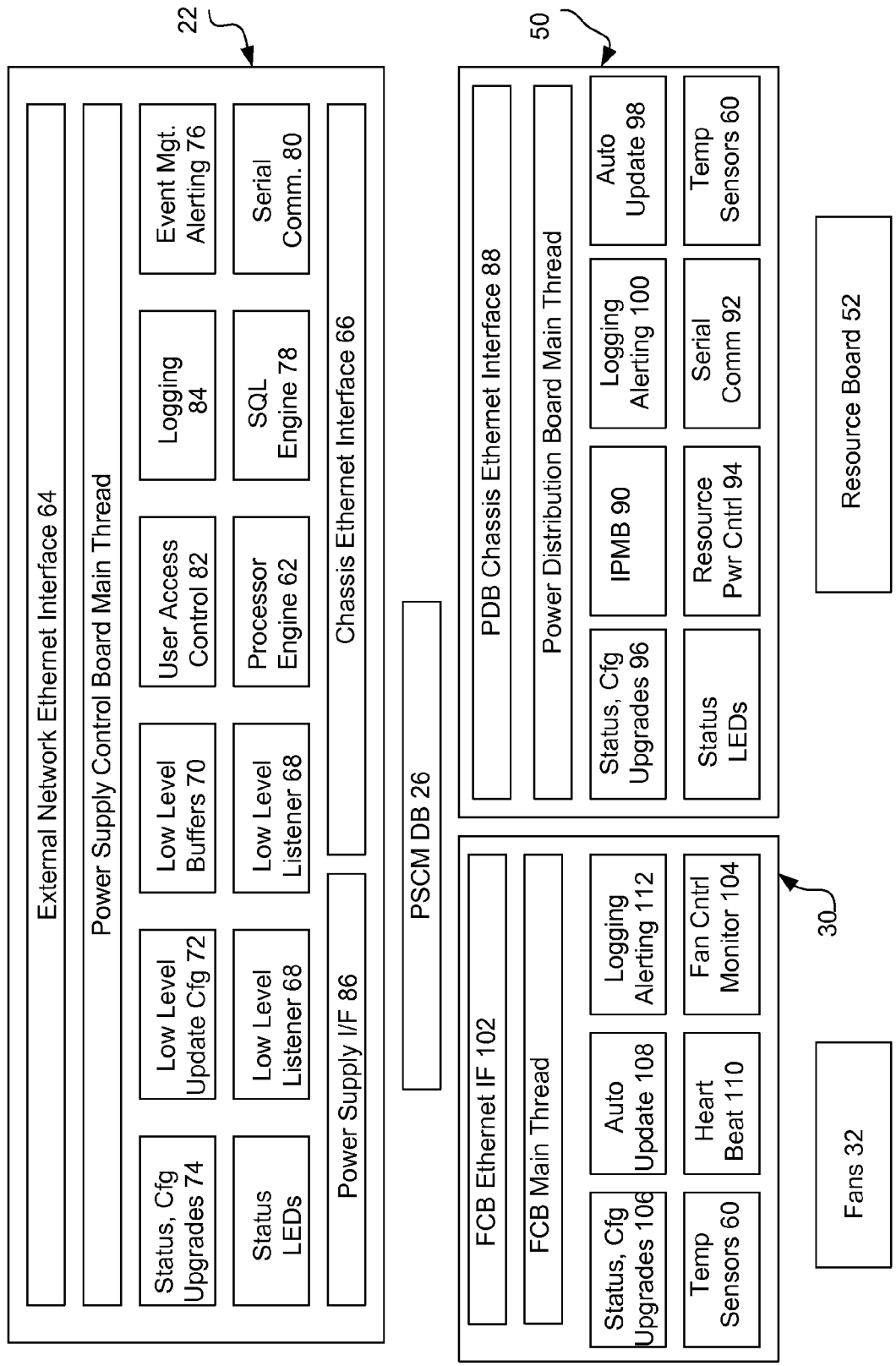
FIG. 4 depicts a block diagram of a software architecture for management of server resources.

Referring now to FIG. 4, a block diagram depicts a software architecture for management of server resources. Overall system management functions are performed with three separate circuit board architectures, a power supply control board 22, a power distribution board 50 disposed at each resource sled, and redundant fan control boards 30. Power supply control board 22 has processing engine 62 to execute management applications and provides a 1 Gb Ethernet interface 64 to an external network and a 10/100 Mb Ethernet interface 66 to coordinate communication from an external network to low level controllers, such as the power distribution boards 50 and fan control boards 30. Power supply control board 22 uses low level listeners 68 to discover and track low level controllers through a low-level console buffer 70. A low level controller update and configuration engine 72 configures the controllers for periodical status updates tracked by a status change and upgrade engine 74 and to issue alerts at preset filter events through an event management and monitoring engine 76. Updates are stored and processed with an SQL engine 78 to aid decision making, for historic data characterization and for trend prognosis. A serial port interface 80 communicates with serial devices, such as PDU's or serial consoles. A user access control 82 monitors access permissions to functions at power supply control board 22 and to low level controller functions, with access tracked by a logging module 84. A power control interface 86 supports communication with power supplies 16 to perform chassis power allocation.

Power distribution board 50 supports communication between power supply control board 22 and resource board 52 through an Ethernet module 88 and IPMI with an IPMB header 90 and serial interface 92, such as via RS232. Temperatures sensed by temperature sensors 60 at power distribution board 50 and its associated server resource 52 are returned through Ethernet interface 88 to power supply control board 22. A resource power control engine 94 control application of power to resource 52 as allocated by power supply control board 22. A status engine 96 monitors the state of updates and configurations at power distribution board 50 with an automatic update module 98 performing updates provided through Ethernet interface 88. Logging and alert module 100 tracks user inputs and alerts at power distribution board 50.

Fan control board 30 maintains cooling fan 32 operations at speeds set by power supply control board 22 as communicated through an Ethernet interface 102 under local control of a fan control and monitoring engine 104. Fan control and monitoring engine 104 monitors temperatures sensed with a sensor 60 and communicates temperatures through Ethernet interface 102 to power supply control board 22. A status module 106 monitors the status, configuration and upgrades at fan control board 30 with automatic updates performed by an update module 108. A heartbeat module 110 tracks operations of fan control board 30 to insure failover to a redundant fan control board in the event of a failure. A logging module 112 tracks user inputs at fan control module 30 and issues alerts in the event of system failures.

Figure 5:
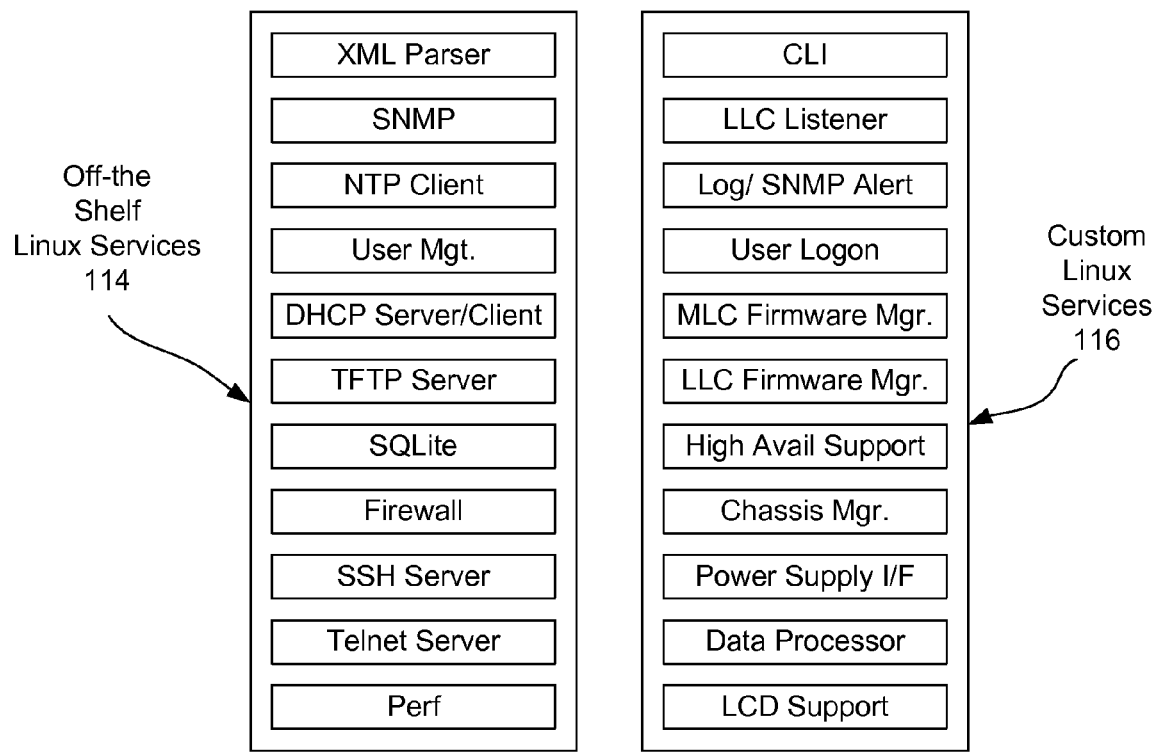
FIG. 5 depicts a block diagram of software modules for execution at a power supply control board.

Referring now to FIG. 5, a block diagram depicts software modules for execution at a power supply control board 22. A set of standard Linux services provide server functionality for power supply control board 22 to manage power distribution boards 50 as clients in a local area network configuration, such as with an SSH server to coordinate communications from an outside network to power distribution boards and a DHCP server and client module to managing addressing of Ethernet NICs disposed in the power distribution boards and fan control boards. A set of custom Linux services provides specific functions for management of chassis functions. For example, a chassis-level management module determines power allocation and fan speeds for chassis power and cooling fan assets.

Although the present invention has been described in detail, it should be understood that various changes, substitutions and alterations can be made hereto without departing from the spirit and scope of the invention as defined by the appended claims.

What is claimed is:

1. An information handling system comprising:
a chassis having plural slots, each slot operable to accept a sled;
a power supply control board disposed on a management sled, the power supply control board having a first Ethernet interface to a network, a second Ethernet interface to the plural slots, a power supply interface and logical resources for managing communications between the network and plural slots and for providing power from a power supply to the plural slots;

plural resource sleds, each resource sled having a resource board for performing an information handling function, and a power distribution board, the power distribution board having an Ethernet interface with the power supply control board, a communications interface with the resource board and logical resources, the logical resources managing application of power provided from the power supplies to the resource board and communication from the power supply control board to the resource board; and at least one fan control board that communicates with the power supply control board through the Ethernet interface to control fan operation.

2. The information handling system of claim 1 wherein the resource board comprises a processor that serves information through a network to one or more clients.

3. The information handling system of claim 1 wherein the resource board comprises plural storage devices accessible by clients through a network.

4. The information handling system of claim 1 wherein the communications interface between the resource board and the power distribution board comprises a serial link.

5. The information handling system of claim 1 further comprising a fan control board interfaced with the power supply control board and operable to control cooling fan operations at the chassis.

6. The information handling system of claim 5 further comprising temperature sensors disposed at the resource sleds, the power distribution boards operable to communicate temperatures of the temperature sensors through the power supply control board to the fan control board for use in setting fan speeds.

7. The information handling system of claim 1 further comprising a switch disposed in the chassis to interface the power supply control board second Ethernet interface with the Ethernet interface of each power distribution board.

8. The information handling system of claim 1 wherein the power supply control board first Ethernet interface comprises a 1 Gb network interface card and the power supply control board second Ethernet interface comprises a 10/100 Mb network interface card.

9. A method for managing plural server resources with a common chassis, the method comprising:

receiving at a power supply control board disposed on a first sled in the chassis an external network communication for a selected of plural resource boards, the selected resource board disposed on a second sled in the chassis;

providing the external network communication from the power supply control board to a power distribution board through an Ethernet interface, the power distribution board disposed on the second sled;

managing a response to the external network communication by the selected resource board with the power distribution board; and managing chassis cooling with a fan controller interfaced with the power supply control board.

10. The method of claim 9 further comprising:

allocating power between plural resource boards with the power supply control board; and managing power distribution at each resource board with a power distribution board disposed in a common sled with each resource board.

11. The method of claim 9 wherein managing a response further comprises powering up the resource board.

12. The method of claim 9 wherein managing a response further comprises communicating with the resource board through a serial interface.

13. The method of claim 9 wherein the resource board comprises a server that serves clients through a network interface at the resource board.

14. The method of claim 9 wherein the resource board comprises plural storage device accessible to clients through a network interface at the resource board.

15. The method of claim 9 further comprising:

measuring a temperature at a resource board;

sending the temperature from the power distribution board associated with the resource board through the Ethernet interface to the power supply control board;

calculating a volume of airflow through the chassis; and sending an airflow correction from the power supply control board to the fan controller based on the temperature.

16. A system for supporting plural information handling system server boards, the system comprising:

a chassis having plural slots, each slot operable to accept a sled;

one or more power supplies operable to supply power to the slots;

a power supply controller board interfaced with the power supply and operable to allocate power to the slots; and first and second network interface cards integrated with the power supply controller, the first network interface card operable to communicate with a network external to the chassis, the second network interface card operable to communicate with the slots through an Ethernet cable;

at least one fan control board that communicates with the power supply control board through the Ethernet interface to control fan operation.

17. The system of claim 16 further comprising a power distribution board associated with each of plural slots, each power distribution board having a network interface card to communicate with the power supply controller board through the Ethernet cable.

18. The system of claim 17 wherein each power distribution board couples to a server resource board to manage application of power to the server resource board.

19. The system of claim 18 wherein the power distribution board couples to the server resource board through a serial interface.

* * * * *